US007851693B2

(12) United States Patent
Fork et al.

(10) Patent No.: US 7,851,693 B2
(45) Date of Patent: Dec. 14, 2010

(54) PASSIVELY COOLED SOLAR CONCENTRATING PHOTOVOLTAIC DEVICE

(75) Inventors: David K. Fork, Los Altos, CA (US); Stephen J. Horne, El Granada, CA (US)

(73) Assignees: Palo Alto Research Center Incorporated, Palo Alto, CA (US); SolFocus, Inc., Mountain View, CA (US)

( * ) Notice: Subject to any disclaimer, the term of this patent is extended or adjusted under 35 U.S.C. 154(b) by 338 days.

(21) Appl. No.: 11/381,999

(22) Filed: May 5, 2006

(65) Prior Publication Data

US 2007/0256724 A1 Nov. 8, 2007

(51) Int. Cl.
*H01L 31/042* (2006.01)
(52) U.S. Cl. .................. 136/246; 136/244; 136/259; 136/256
(58) Field of Classification Search .......... 136/242–265
See application file for complete search history.

(56) References Cited

U.S. PATENT DOCUMENTS

| 2,031,387 | A |   | 2/1936  | Schwarz         |
|-----------|---|---|---------|-----------------|
| 2,789,731 | A |   | 4/1957  | Marraffino      |
| 3,032,008 | A |   | 5/1962  | Land et al.     |
| 3,159,313 | A |   | 12/1964 | Guilford        |
| 3,602,193 | A |   | 8/1971  | Adams et al.    |
| 3,973,994 | A |   | 8/1976  | Redfield        |
| 3,988,166 | A |   | 10/1976 | Beam            |
| 4,018,367 | A |   | 4/1977  | Morine et al.   |
| 4,021,267 | A |   | 5/1977  | Dettling        |
| 4,045,246 | A | * | 8/1977  | Mlavsky et al. ............. 136/246 |
| 4,053,327 | A |   | 10/1977 | Meulenberg, Jr. |

(Continued)

FOREIGN PATENT DOCUMENTS

CN    2606309 Y    3/2004

(Continued)

OTHER PUBLICATIONS

Terao, Akira "MicroDish: A Novel Reflective Optic for Flat-Plate Micro-Concentrator", SPIE's 49$^{th}$ Annual Meeting, Aug. 2-6, 2004, Denver, Colorado, USA, 9 pages.

(Continued)

*Primary Examiner*—Nam X Nguyen
*Assistant Examiner*—Bach T Dinh
(74) *Attorney, Agent, or Firm*—Bever, Hoffman & Harms, LLP; Patrick T. Bever

(57) ABSTRACT

A Cassegrain-type concentrating solar collector cell includes primary and secondary mirrors disposed on opposing convex and concave surfaces of a light-transparent (e.g., glass) optical element. Light enters an aperture surface surrounding the secondary mirror, and is reflected by the primary mirror toward the secondary mirror, which re-reflects the light onto a photovoltaic cell. The photovoltaic cell is mounted on a central portion of heat spreader that extends over the primary mirror. The heat spreader transmits waste heat from the photovoltaic cell in a manner that evenly distributes the heat over the optical element, thereby maximizing the radiation of heat from the aperture surface into space. The heat spreader includes a thick copper layer formed on a flexible substrate (e.g., polyimide film) that is patterned with radial arms that facilitate mounting onto the convex surface of the optical element.

17 Claims, 4 Drawing Sheets

U.S. PATENT DOCUMENTS

| | | | |
|---|---|---|---|
| 4,084,985 A | 4/1978 | Evans, Jr. | |
| 4,086,485 A | 4/1978 | Kaplow et al. | |
| 4,095,997 A | 6/1978 | Griffiths | |
| 4,119,058 A | 10/1978 | Schmermund | |
| 4,131,485 A | 12/1978 | Meinel et al. | |
| 4,141,231 A | 2/1979 | Kudlich | |
| 4,148,301 A | 4/1979 | Cluff | |
| 4,153,476 A | 5/1979 | Shelpuk | |
| 4,177,083 A | 12/1979 | Kennedy | |
| 4,221,468 A | 9/1980 | Macken | |
| 4,224,081 A | 9/1980 | Kawamura et al. | |
| 4,254,894 A | 3/1981 | Fetters | |
| 4,331,703 A | 5/1982 | Lindmayer | |
| 4,337,758 A | 7/1982 | Meinel et al. | |
| 4,355,196 A | 10/1982 | Chai | |
| 4,461,403 A | 7/1984 | Prahs | |
| 4,476,165 A | 10/1984 | McIntyre | |
| 4,490,418 A | 12/1984 | Yoshida | |
| 4,521,457 A | 6/1985 | Russell et al. | |
| 4,540,843 A | 9/1985 | Gochermann et al. | |
| 4,602,120 A | 7/1986 | Wakefield et al. | |
| 4,683,348 A | 7/1987 | Pidgeon et al. | |
| 4,746,370 A | 5/1988 | Woolf | |
| 4,747,517 A | 5/1988 | Hart | |
| 4,792,685 A | 12/1988 | Yamakawa | |
| 4,796,038 A | 1/1989 | Allen et al. | |
| 4,826,777 A | 5/1989 | Ondris | |
| 4,841,946 A | 6/1989 | Marks | |
| 4,847,349 A | 7/1989 | Ohta et al. | |
| 4,849,028 A * | 7/1989 | Krause | 136/256 |
| 4,855,884 A * | 8/1989 | Richardson | 362/278 |
| 4,938,994 A | 7/1990 | Choinski | |
| 4,947,825 A * | 8/1990 | Moriarty | 126/685 |
| 4,952,026 A | 8/1990 | Bellman et al. | |
| 5,000,988 A | 3/1991 | Inoue et al. | |
| 5,004,319 A | 4/1991 | Smither | |
| 5,011,565 A | 4/1991 | Dube et al. | |
| 5,062,899 A | 11/1991 | Kruer | |
| 5,075,281 A | 12/1991 | Testardi | |
| 5,089,055 A | 2/1992 | Nakamura | |
| 5,151,377 A | 9/1992 | Hanoka et al. | |
| 5,167,724 A * | 12/1992 | Chiang | 136/246 |
| 5,180,441 A | 1/1993 | Cornwall et al. | |
| 5,188,789 A | 2/1993 | Nishiura | |
| 5,213,628 A | 5/1993 | Noguchi et al. | |
| 5,216,543 A | 6/1993 | Calhoun | |
| 5,254,388 A | 10/1993 | Melby et al. | |
| 5,344,496 A | 9/1994 | Stern et al. | |
| 5,353,813 A | 10/1994 | Deevi et al. | |
| 5,356,488 A | 10/1994 | Hezel | |
| 5,389,159 A | 2/1995 | Kataoka et al. | |
| 5,449,413 A | 9/1995 | Beauchamp et al. | |
| 5,501,743 A | 3/1996 | Cherney | |
| 5,529,054 A | 6/1996 | Shoen | |
| 5,536,313 A | 7/1996 | Watanabe et al. | |
| 5,538,563 A | 7/1996 | Finkl | |
| 5,540,216 A | 7/1996 | Rasmusson | |
| 5,543,333 A | 8/1996 | Holdermann | |
| 5,552,820 A | 9/1996 | Genovese | |
| 5,559,677 A | 9/1996 | Errichiello | |
| 5,560,518 A | 10/1996 | Catterall et al. | |
| 5,569,399 A | 10/1996 | Penney et al. | |
| 5,590,818 A | 1/1997 | Raba et al. | |
| 5,665,175 A | 9/1997 | Safir | |
| 5,700,325 A | 12/1997 | Watanabe | |
| 5,733,608 A | 3/1998 | Kessel et al. | |
| 5,873,495 A | 2/1999 | Saint-Germain | |
| 5,918,771 A | 7/1999 | van der Heijden | |
| 5,929,530 A | 7/1999 | Stone | |
| 5,949,123 A | 9/1999 | Le et al. | |
| 5,981,902 A | 11/1999 | Arita et al. | |
| 5,990,413 A | 11/1999 | Ortabasi | |
| 6,008,449 A | 12/1999 | Cole | |
| 6,011,307 A | 1/2000 | Jiang et al. | |
| 6,020,554 A * | 2/2000 | Kaminar et al. | 136/246 |
| 6,032,997 A | 3/2000 | Elliott et al. | |
| 6,047,862 A | 4/2000 | Davies | |
| 6,091,017 A * | 7/2000 | Stern | 136/246 |
| 6,118,067 A * | 9/2000 | Lashley et al. | 136/245 |
| 6,130,465 A | 10/2000 | Cole | |
| 6,140,570 A * | 10/2000 | Kariya | 136/256 |
| 6,164,633 A | 12/2000 | Mulligan et al. | |
| 6,203,621 B1 | 3/2001 | Tran et al. | |
| 6,232,217 B1 | 5/2001 | Ang et al. | |
| 6,257,450 B1 | 7/2001 | Jackson et al. | |
| 6,274,508 B1 | 8/2001 | Jacobsen et al. | |
| 6,278,054 B1 | 8/2001 | Ho et al. | |
| 6,293,498 B1 | 9/2001 | Stanko et al. | |
| 6,310,281 B1 | 10/2001 | Wendt et al. | |
| 6,323,415 B1 | 11/2001 | Uematsu et al. | |
| RE37,512 E | 1/2002 | Szlufcik et al. | |
| 6,351,098 B1 | 2/2002 | Kaneko | |
| 6,354,791 B1 | 3/2002 | Wytman et al. | |
| 6,379,521 B1 | 4/2002 | Nishio | |
| 6,398,370 B1 | 6/2002 | Chiu et al. | |
| 6,407,329 B1 | 6/2002 | Iino et al. | |
| 6,410,843 B1 | 6/2002 | Kishi et al. | |
| 6,418,986 B1 | 7/2002 | Gabriele | |
| 6,420,266 B1 | 7/2002 | Smith et al. | |
| 6,423,140 B1 | 7/2002 | Liu et al. | |
| 6,429,037 B1 | 8/2002 | Wenham et al. | |
| 6,479,395 B1 | 11/2002 | Smith et al. | |
| 6,527,964 B1 | 3/2003 | Smith et al. | |
| 6,531,653 B1 * | 3/2003 | Glenn et al. | 136/246 |
| 6,555,739 B2 | 4/2003 | Kawam | |
| 6,568,863 B2 | 5/2003 | Murata | |
| 6,590,235 B2 | 7/2003 | Carey et al. | |
| 6,597,510 B2 | 7/2003 | Bunkenburg et al. | |
| 6,623,579 B1 | 9/2003 | Smith et al. | |
| 6,663,944 B2 | 12/2003 | Park et al. | |
| 6,666,165 B2 | 12/2003 | Shiraishi et al. | |
| 6,667,434 B2 | 12/2003 | Morizane et al. | |
| 6,743,478 B1 | 6/2004 | Kiiha et al. | |
| 6,890,167 B1 | 5/2005 | Kwok et al. | |
| 6,896,381 B2 | 5/2005 | Benitez et al. | |
| 6,924,493 B1 | 8/2005 | Leung | |
| 7,045,794 B1 | 5/2006 | Spallas et al. | |
| 7,101,592 B2 | 9/2006 | Gueggi et al. | |
| 7,152,985 B2 | 12/2006 | Benitez et al. | |
| 7,160,522 B2 | 1/2007 | Minano Dominguez et al. | |
| 7,181,378 B2 | 2/2007 | Benitez et al. | |
| 7,388,147 B2 | 6/2008 | Mulligan et al. | |
| 7,394,016 B2 | 7/2008 | Gronet | |
| 2001/0008230 A1 | 7/2001 | Keicher et al. | |
| 2002/0056473 A1 | 5/2002 | Chandra et al. | |
| 2002/0060208 A1 | 5/2002 | Liu et al. | |
| 2002/0148497 A1 | 10/2002 | Sasaoka et al. | |
| 2002/0149107 A1 | 10/2002 | Chang et al. | |
| 2002/0154396 A1 | 10/2002 | Overbeck | |
| 2003/0015820 A1 | 1/2003 | Yamazaki et al. | |
| 2003/0095175 A1 | 5/2003 | Agorio | |
| 2003/0129810 A1 | 7/2003 | Barth et al. | |
| 2003/0201581 A1 | 10/2003 | Weber et al. | |
| 2003/0232174 A1 | 12/2003 | Chang et al. | |
| 2004/0012676 A1 | 1/2004 | Weiner et al. | |
| 2004/0031517 A1 * | 2/2004 | Bareis | 136/246 |
| 2004/0048001 A1 | 3/2004 | Kiguchi et al. | |
| 2004/0070855 A1 | 4/2004 | Benitez et al. | |
| 2004/0084077 A1 | 5/2004 | Aylaian | |
| 2004/0151014 A1 | 8/2004 | Speakman | |
| 2004/0191422 A1 | 9/2004 | Kataoka | |
| 2004/0200520 A1 | 10/2004 | Mulligan et al. | |
| 2004/0211460 A1 * | 10/2004 | Simburger et al. | 136/246 |
| 2005/0000566 A1 | 1/2005 | Posthuma et al. | |

| | | | |
|---|---|---|---|
| 2005/0029236 | A1 | 2/2005 | Gambino et al. |
| 2005/0034751 | A1 | 2/2005 | Gross et al. |
| 2005/0046977 | A1 | 3/2005 | Shifman |
| 2005/0067729 | A1 | 3/2005 | Laver et al. |
| 2005/0081908 | A1 | 4/2005 | Stewart |
| 2005/0133084 | A1 | 6/2005 | Joge et al. |
| 2005/0194037 | A1 | 9/2005 | Asai |
| 2005/0221613 | A1 | 10/2005 | Ozaki et al. |
| 2005/0253308 | A1 | 11/2005 | Sherwood |
| 2006/0207650 | A1* | 9/2006 | Winston et al. ............. 136/259 |
| 2006/0231133 | A1 | 10/2006 | Fork et al. |
| 2006/0251796 | A1 | 11/2006 | Fellingham |
| 2006/0266235 | A1 | 11/2006 | Sandhu et al. |
| 2008/0047605 | A1 | 2/2008 | Benitez et al. |
| 2008/0138456 | A1 | 6/2008 | Fork et al. |

FOREIGN PATENT DOCUMENTS

| | | |
|---|---|---|
| CN | 1854637 A | 11/2006 |
| DE | 19735281 A1 | 2/1999 |
| EP | 0 257 157 A | 3/1988 |
| EP | 0 851 511 A | 7/1998 |
| EP | 1 145 797 A | 10/2001 |
| EP | 1 351 318 A | 10/2003 |
| EP | 1 715 260 A | 10/2006 |
| EP | 1 763 086 A | 3/2007 |
| EP | 1 787 786 A | 5/2007 |
| EP | 1 833 099 A | 9/2007 |
| JP | 60082680 A | 10/1985 |
| JP | 02 187291 A | 7/1990 |
| JP | 2002111035 A | 4/2002 |
| JP | 2004-266023 A | 9/2004 |
| JP | 2005051216 | 2/2005 |
| WO | WO 91/08503 A | 6/1991 |
| WO | WO 91/15355 | 10/1991 |
| WO | WO 92/15845 A | 9/1992 |
| WO | WO 94/28361 A1 | 12/1994 |
| WO | WO 97/21253 A | 6/1997 |
| WO | WO 97/48519 A | 12/1997 |
| WO | WO 00/49421 A1 | 8/2000 |
| WO | WO 00/49658 A1 | 8/2000 |
| WO | WO 00/50215 | 8/2000 |
| WO | WO 02/052250 A | 7/2002 |
| WO | WO 02/97724 A1 | 12/2002 |
| WO | WO 03/047005 A | 6/2003 |
| WO | WO 03/076701 A | 9/2003 |
| WO | WO 2005/070224 A1 | 8/2005 |
| WO | WO 2005/107957 A1 | 11/2005 |
| WO | WO 2005/107958 A1 | 11/2005 |
| WO | WO 2006/097303 A1 | 9/2006 |
| WO | WO 2007/104028 | 9/2007 |

OTHER PUBLICATIONS

Gordon et al. "Optical performance at the thermodynamic limit with tailored imagin designs", Dec. 2004, 16 pages.

Mulligan et al. "A Flat-Plate Concentrator: Micro-Concentrator Design Overview", 2000 IEEE, pp. 1495-1497.

Swanson, Richard M. "The Promise of Concentrators", Received Jun. 16, 1999, Revised Oct. 3, 1999, pp. 93-111.

Bert et al. "FLATCON™ and FLASHCON™ Concepts for High Concentration PV", Presented at the 19$^{th}$ European Photovoltaic Solar Energy Conf., Jun. 7-11, 2004, Paris, 4 pages.

Alvarez et al. "RXI Concentrator for 1000X Photovoltaic Energy Conversion".

Mulligan et al. "Development of Chip-Size Silicon Solar Cells".

Nguyen Luu "Wafer Level Packaging for Analog/Mixed Signal Applications", MEPTEC Int. Wafer Level Packaging Conference, Aug. 22, 2002.

Benitez et al. "High-Concentration Mirror-Based Kohler Integrating System for Tandem Solar Cells", WCPEC2006, 4 pages.

J. Sun et al. "Modeling and Experimental Evaluation of Passive Heat Sinks for Miniature High-Flux Photovoltaic Concentrators", Transactions of the ASME, vol. 127, pp. 138-145 (2005).

Terao et al. "A Mirror-Less Design for Micro-Concentrator Modules", Conference Record of the 28$^{th}$ IEEE Photovoltaic Specialists Conference (2000) pp. 1416-1419.

International Search Report and Written Opinion of the International Searching Authority, International Application Serial No. PCT/US07/67016, Aug. 7, 2008, 11 pages.

U.S. Appl. No. 11/282,882, filed Nov. 17, 2005, Fork et al.
U.S. Appl. No. 11/282,829, filed Nov. 17, 2005, Fork et al.
U.S. Appl. No. 11/336,714, filed Jan. 20, 2006, Fork et al.

Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.

Cuevas et al. "50 Per Cent More Output Power from an Albedo-Collecting Flat Panel Using Bifacial Solar Cells", Solar Energy, vol. 29, No. 5, pp. 419-420, 1982.

Finlayson et al. "$Bi_2O_3$-$Wo_3$ compounds for photocatalytic applications by solid state and viscous processing", Title from a conference scheduled for Oct. 6-7, 2004 in Munich, 8 pages.

Kenis et al. "Fabrication inside Microchannels Using Fluid Flow", Accounts of Chemical Research, vol. 33, No. 12, 2000, pp. 841-847.

Kerschaver et al. "Back-contact Solar Cells: A Review," Progress in Photovoltaics: Research and Applications, 2006, vol. 14, pp. 107-123.

Kränzl et al. "Bifacial Solar Cells on Multi-Crystalline Silicon", 15$^{th}$ International Photovoltaic Science & Engineering Conference, Shanghai, China, 2 pages, 2005.

Mueller et al. "Breathable Polymer Films Produced by the Microlayer Coextrusion Process", Journal of Applied Polymer Science, vol. 78, pp. 816-828, 2000.

Neuhaus et al. "Industrial Silicon Wafer Solar Cells," Advances in OptoElectronics, vol. 2007, 2007, 15 pages.

Rao et al. "Microfabricated Deposition Nozzles for Direct-Write Assembly of Three-Dimensional Periodic Structures", *Advanced Materials*, vol. 17, No. 3, Feb. 10, 2005, 5 pages.

Recart et al. "Large Area Thin BSF Solar Cells With Simultaneously Diffused Boron and Phosphorus Screen Printed Emitters", IEEE, pp. 1213-1216, 2005.

Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.

Taguchi et al. An Approach for the Higher Efficiency in the HIT Cells, IEEE, pp. 866-871, 2005.

Van Hoy et al. "Microfabrication of Ceramics by Co-extrusion", *J. Am. Ceram. Soc.*, vol. 81, No. 1, pp. 152-158, 1998.

Weber et al. "Modelling of Sliver® Modules Incorporating a Lambertian Rear Reflector", The Australian National University, Canberra ACT 0200, Australia, 4 pages, 2005.

Gimac Compact Triplex TR12 Micro-Coextrusion Plant, NPE 2000, Jun. 19-23, 2000, McCormick Place, Chicago, IL, Booth 13154, http://www.citsco.com/NPE2000/npepage1.html, 2 pages.

Extrusion/Coextrusion Dies, Extrusion Dies Industries, LLC, http://www.extrusiondies.com/PRODUCTS/ExtrusionDies/multimanifoldDies.html, 1 page.

Hitachi: Offering Total Environmental Solutions, Environmental Activities, http://greenweb.hitachi.co.jp/en/sustainable/total-solution.html, 5 pages, 2003.

Sanyo Solar Panels, Sanyo HIT Solar Panel Discount—Solar Electric Supply, Sanyo Solar Modules, http://www.solarelectricsupply.com/Solar‾Panels/Sanyo/sanyo.html, 4 pages, 2005.

SunPower Corp. News Release, May 12, 2008, Available URL: http://investors.sunpowercorp.com/releasedetail.cfm?ReleaseID=309613.

Schweizer, Peter M. "Curtain Coating Technology Can Mean Big Benefits," Paper, Film & Foil Converter website, Mar. 1, 2000, 5 pages, http://pffc-online.com/mag/paper_curtain_coating_technology/.

Nijs et al. "Overview of solar cell technologies and results on high efficiency multicrystalline silicon substrates," Solar Energy Materials and Solar Cells, vol. 48, No. 1-4, Nov. 1, 1997, pp. 199-217.

Sparber et al. "Comparison of texturing methods for monocrystalline silicon solar cells using KOH and $Na_2CO_3$," 3$^{rd}$ World Conf. Photovoltaic Energy Conversion, Osaka, 2003, pp. 1372-1375.

Macdonald et al. "Texturing industrial multicrystalline silicon solar cells," Solar Energy, vol. 76, 2004, pp. 277-283.

Tool et al. "Straightforward in-line processing for 16.8% efficient mc-Si solar cells," 31$^{st}$ IEEE Photovoltaic Specialists Conf., Florida, 2005, pp. 1324-1327.

Fukui et al. "17.7% efficiency large area multicrystalline silicon solar cell using screen-printed metallization technique," 31$^{st}$ IEEE Photovoltaic Specialists Conf., Florida, 2005, pp. 979-982.

Mitsubishi Electric Corp., Mitsubishi Electric Develops Practical-Use Multi-Crystalline Silicon Solar Cell with World's Highest Conversion Efficiency Rate of 18.6%, News Release #2432, Tokyo, Mar. 19, 2008, Available URL: http://global.mitsubishielectric.com/news/news_releases/2008/mel0705.pdf.

Zhao et al. "19.8% efficient 'honeycomb' textured multicrystalline and 24.4% monocrystalline silicon solar cells," Applied Physics Letters, vol. 73, pp. 1991-1993, 1998.

Abbott et al. "Optical and Electrical Properties of Laser Texturing for High-efficiency Solar Cells," Progress in Photovoltaics: Research and Applications, Published online Jan. 5, 2006, vol. 14, pp. 225-235, 2006.

Murphy, Jr. "Home photovoltaic systems for physicists" *Physics Today*, Jul. 2008, pp. 42-47.

Brogren et al. "Optical properties, durability, and system aspects of a new aluminum-polymer-laminated steel reflector for solar concentrators", Jan. 2004, Solar Energy Materials and Solar Cells, 82, pp. 387-412.

Mauk et al. "'Buried' Metal/Dielectric/Semiconductor Reflectors for Light Trapping in Epitaxial Thin-Film Solar Cells", May 1996, IEEE, 25th PVSC, pp. 147-150.

Munzer et al. "Thin Monocrystalline Silicon Solar Cells, Oct. 1999, IEEE Transactions on Electron Devices", vol. 46, No. 10, pp. 2055-2061.

Knight et al. "Hydrodynamic Focusing on a Silicon Chip: Mixing Nanoliters in Microseconds", Physical Review Letters, vol. 80, No. 17, Apr. 27, 1998, pp. 3863-3866.

Raabe et al. "High Aspect Ratio Screen Printed Fingers", 20th European Solar Energy Conference and Exhibition, Barcelona, Spain, Jun. 6-10, 2005, 4 pgs.

Bejan, Adrian "Chapter Five, Buckling Flows: A New Frontier in Fluid Mechanics", Annual Review of Numerical Fluid Mechanics and Heat Transfer, vol. 1, Ed. T. C. Chawla, Hemisphere Publishing Corporation, 1987, pp. 262-304.

Liang et al. "Co-Extrusion of Solid Oxide Fuel Cell Functional Elements", Ceramic Engineering and Science Proceedings, vol. 20, No. 4, 1999, pp. 587-594.

Shannon et al. "The Production of Alumina/Zirconia Laminated Composites by Co-Extrusion", Ceramic Engineering and Science Proceedings, vol. 16, No. 5, 1955, pp. 1115-1120.

Kenis et al. "Microfabrication Inside Capillaries Using Multiphase Laminar Flow Patterning", Science, vol. 285, Jul. 2, 1999, pp. 83-85.

Szlufcik et al. "Low-Cost Industrial Technologies of Crystalline Silicon Solar Cells", Proc. of the IEEE, vol. 85, No. 5, May 1, 1997, pp. 711-730.

Ruthe et al. "Etching of $CuInSe_2$ Thin Films-Comparison of Femtosecond and Picosecond Laser Ablation", Applied Surface Science, vol. 247, No. 1-4, Jul. 15, 2005, pp. 447-452.

* cited by examiner

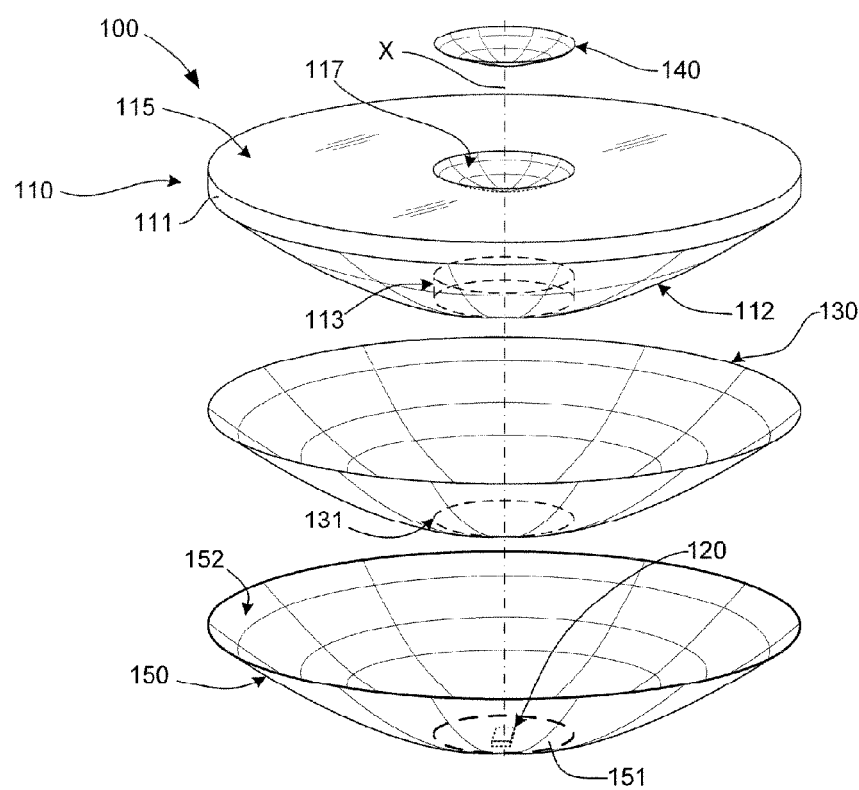
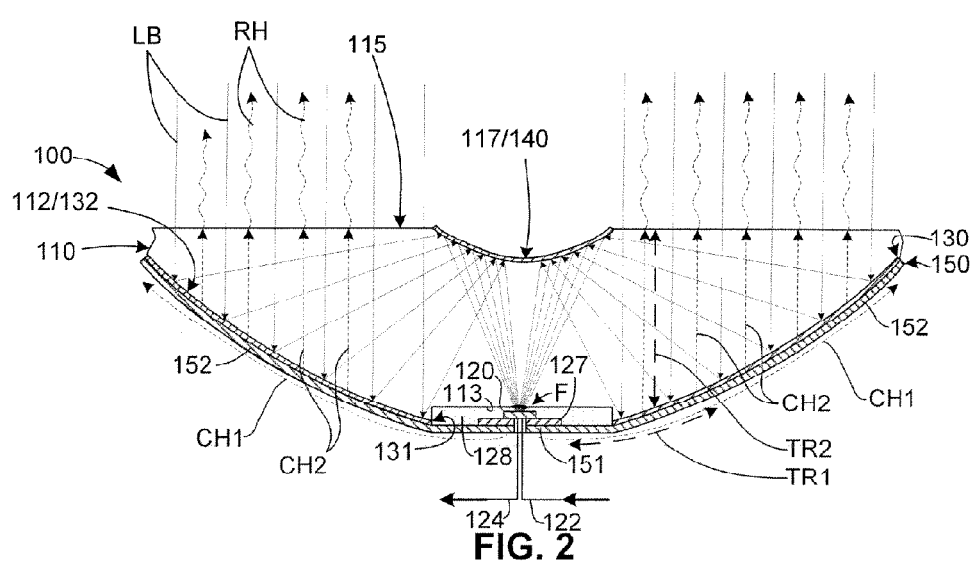
FIG. 1
FIG. 2

PASSIVELY COOLED SOLAR CONCENTRATING PHOTOVOLTAIC DEVICE

FIELD OF THE INVENTION

This invention relates to solar power generators, more particularly to managing the heat generated at and around the photovoltaic (PV) cell in solid dielectric solar concentrator photovoltaic (CPV) devices.

BACKGROUND OF THE INVENTION

Photovoltaic solar energy collection devices used to generate electric power generally include flat-panel collectors and concentrating solar collectors. Flat collectors generally include PV cell arrays and associated electronics formed on semiconductor (e.g., monocrystalline silicon or polycrystalline silicon) substrates, and the electrical energy output from flat collectors is a direct function of the area of the array, thereby requiring large, expensive semiconductor substrates. Concentrating solar collectors reduce the need for large semiconductor substrates by concentrating light beams (i.e., sun rays) using, e.g., a parabolic reflectors or lenses that focus the beams, creating a more intense beam of solar energy that is directed onto a small PV cell. Thus, concentrating solar collectors have an advantage over flat-panel collectors in that they utilize substantially smaller amounts of semiconductor. Another advantage that concentrating solar collectors have over flat-panel collectors is that they are more efficient at generating electrical energy.

A problem with conventional concentrating solar collectors is that they are expensive to operate and maintain. The reflectors and/or lenses used in conventional collectors to focus the light beams are produced separately, and must be painstakingly assembled to provide the proper alignment between the focused beam and the PV cell. Further, over time, the reflectors and/or lenses can become misaligned due to thermal cycling or vibration, and become dirty due to exposure to the environment. Maintenance in the form of cleaning and adjusting the reflectors/lenses can be significant, particularly when the reflectors/lenses are produced with uneven shapes that are difficult to clean.

Another problem associated with conventional concentrating solar collectors is damage to the PV cell and mirror structure due to the excessive temperatures generated by the focused light. For reliable operation it is essential to keep the PV cell and its surrounding packaging within safe limits, which is typically well under 100 degrees Celsius (100° C.). Because flat plate photovoltaic modules are exposed to direct (i.e., unfocused) solar light, the temperature rise of most flat plate photovoltaic modules under peak isolation is about 25° C. above ambient in zero wind, which produces a maximum PV cell temperature of about 70° C. (i.e., assuming an ambient temperature of 45° C.). In contrast, concentrating solar collectors produce flux densities of 300 to over 1000 suns at the PV cell, with typically less than half of the energy is converted into electricity and the remainder occurring as heat, producing PV cell temperatures that can reach well above 100° C. A conventional approach to reducing peak PV cell temperatures in concentrating solar collectors includes using a forced liquid cooling system to cool the PV cell, but such forced liquid cooling systems are expensive to produce and maintain, thus significantly increasing the overall production and operating costs of such concentrating solar collectors.

What is needed is a concentrator PV (CPV) device that avoids the expensive assembly and maintenance costs associated with conventional concentrator-type PV cells, and also maintains the CPV device within reliable operating temperatures in a cost effective and reliable manner.

SUMMARY OF THE INVENTION

The present invention is directed to a Cassegrain-type CPV device that induces the efficient radiation of heat out the front of the concentrator by utilizing a heat spreader to evenly distribute heat from the centrally located PV cell over the backside surface of a solid optical element, and by utilizing the solid optical element to transfer the heat from the heat spreader to a front aperture surface, from which the heat is radiated into space. This arrangement facilitates the radiation of more than 30% of the generated heat through the front aperture surface, thus improving passive cooling performance by approximately a factor of two over hollow concentrator systems that radiate heat out the back surface. In addition, the solid optical element facilitates the direct formation of primary and secondary mirrors thereon, thus automatically and permanently aligning the concentrator optics and maintaining optimal optical operation while minimizing maintenance costs.

In accordance with an aspect of the invention, a lateral thermal resistance of the heat spreader is less than a transverse thermal resistance of the solid optical element, thereby optimizing radiant heat transfer by maximizing the heat distribution to maintain the optical element and, hence, the aperture surface at a substantially uniform temperature. In one embodiment, the solid optical element includes a low-iron glass structure having a thickness in the range of 5 to 12 mm and a diameter of approximately 28 mm, and the heat spreader includes copper heat-distributing layer having a nominal thickness of approximately 70 microns. At this thickness, a lateral thermal resistance of the thermal resistance of the copper heat-distributing layer is greater than the transverse thermal resistance of the optical element, thereby producing the desired uniform heating and radiation from the front aperture surface.

In accordance with an embodiment of the present invention, the heat spreader includes a thermal conductive layer (e.g., copper) formed on a flexible substrate (e.g., a polyimide film such as Kapton® produced by DuPont Electronics), and the PV cell is mounted on the heat spreader prior to assembly onto the solid optical element, thereby greatly simplifying the assembly process. In one embodiment the flexible substrate is cut or otherwise separated into a plurality of radial arms that extend from a central support region, which facilitates close contact to curved lower surface of the solid optical element during assembly. The wiring layers of the heat spreader are optionally used to help direct heat to the optical element. In one embodiment, the primary mirror includes a thin silver reflective layer, a copper anti-migration layer disposed on the silver layer, and a barrier paint layer disposed on the anti-migration layer. The heat spreader is then secured to the barrier paint layer by way of a suitable adhesive (e.g., EVA), and a protective shell (e.g., Tedlar) is secured to the backside of the flexible substrate using the same adhesive.

BRIEF DESCRIPTION OF THE DRAWINGS

These and other features, aspects and advantages of the present invention will become better understood with regard to the following description, appended claims, and accompanying drawings, where:

FIG. 1 is an exploded perspective view showing a CPV device according to an embodiment of the present invention;

FIG. 2 is a cross-sectional side view showing the CPV device of FIG. 1 during operation;

DETAILED DESCRIPTION OF THE DRAWINGS

Figure 3:
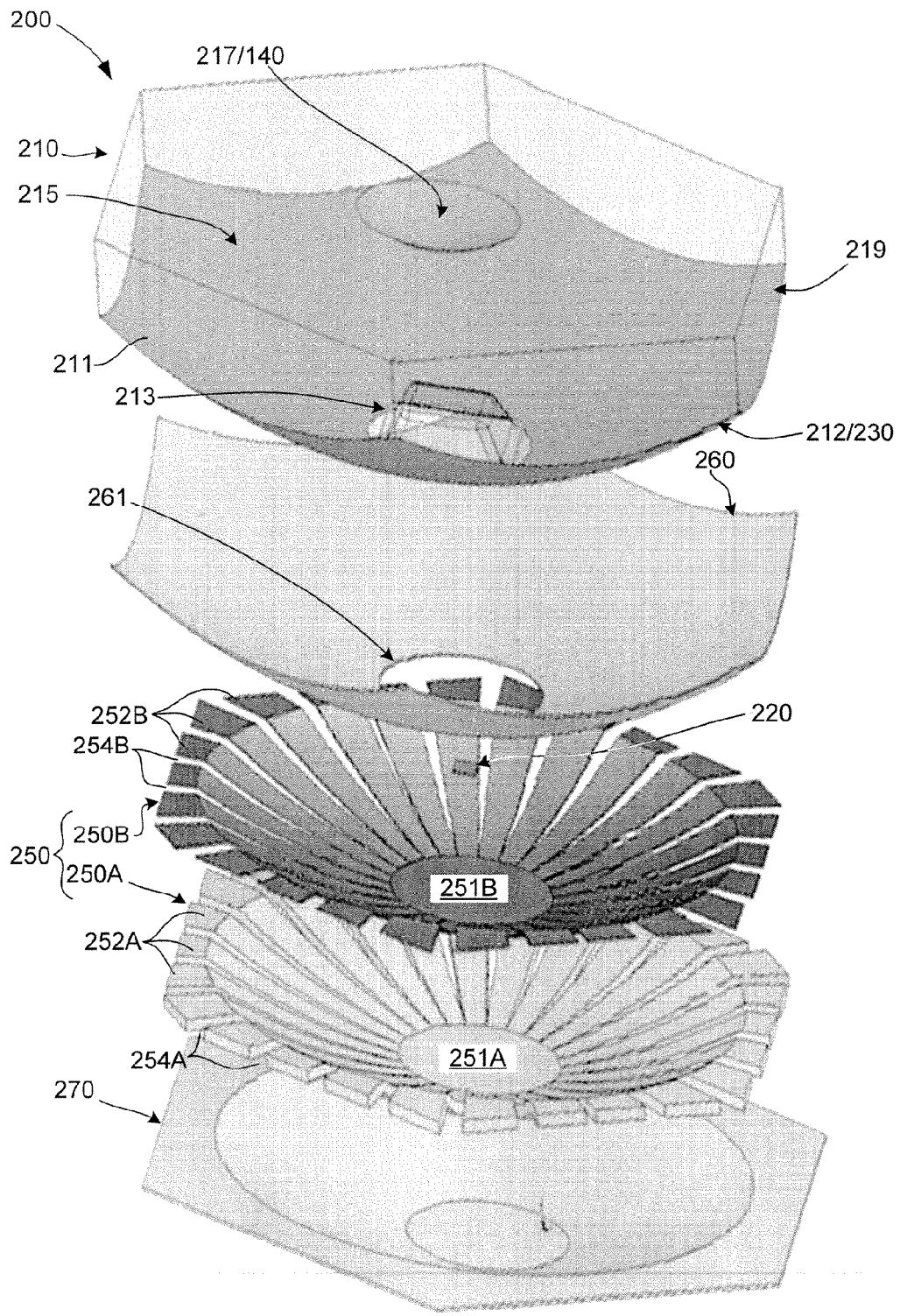
FIG. 3 is an exploded perspective view showing a CPV device according to another embodiment of the present invention.

The present invention relates to managing the heat generated at and around the PV cell in a solid dielectric solar concentrator, such as that disclosed in co-owned and co-pending U.S. patent application Ser. No. 11/110,611 entitled "CONCENTRATING SOLAR COLLECTOR WITH SOLID OPTICAL ELEMENT", which is incorporated herein by reference in its entirety. In particular, the present invention relates to a passive heat management system that avoids the production and maintenance costs of conductive and fluid cooled systems by facilitating the radiation of more than 30% of the generated heat from the front aperture surface of the solid optical element.

In considering the radiation balance of the CPV device, it is important to recognize that the blackbody temperature of the sky is typically on the order of −40 degrees Celsius (−40° C.). The blackbody temperature of the ground is typically about 4° C. above the ambient temperature. It is therefore desirable to provide a thermal path to the front surface of the device so it can radiate heat skyward.

Quantitatively, the net radiation flux per unit area from the front surface of the concentrator can be expressed as:

$$Q_f = \epsilon_f \sigma T_j^4 - (1 - R_f) \sigma T_s^4 \quad \text{Equation 1}$$

where $\epsilon_f$ is the emissivity of the front surface (typically 0.85 for low iron glass), $\sigma$ is the Stefan-Boltzmann constant (5.67× $10^{-8}$ Watts/m² Kelvin⁴), $T_j$ is the absolute temperature of the front surface, $R_f$ is the reflectivity of the front surface (typically about 8%) and $T_s$ is the blackbody temperature of the sky (about −40 Celsius).

The radiation out the back of the concentrator can be expressed similarly as;

$$Q_f = \epsilon_f \sigma T_j^4 - (1 - R_f) \sigma T_s^4 \quad \text{Equation 2}$$

where $\epsilon_f$ is the emissivity of the back surface (typically 0.9 for plastic laminated Tedlar), $T_b$ is the absolute temperature of the concentrator's back surface, $R_b$ is the reflectivity of the concentrator's back surface (typically about 10% for Tedlar in the infrared) and $T_g$ is the blackbody temperature of the ground or rooftop (typically about 4 degrees Celsius above ambient).

What is apparent from Equations 1 and 2 is that the front surface radiates into a much colder bath than the back surface. In flat plate PV systems, more than twice as much heat is typically lost out the front of the panel than out the rear. It is a useful aspect of this invention to create a concentrating PV system that mimics this advantageous heat loss mechanism.

FIG. 1 is an exploded perspective view showing an internal mirror, Cassegrain-type concentrator photovoltaic (CPV) device 100 according to a simplified embodiment of the present invention. Concentrating solar collector 100 generally includes an optical element 110, a photovoltaic (PV) cell 120, a primary mirror 130, a secondary mirror 140, and a heat spreader 150.

Optical element 110 is a solid, disk-like, light-transparent structure including an upper layer 111, a relatively large convex surface 112 protruding from a lower side of upper layer 111, a substantially flat aperture surface 115 disposed on an upper side of upper layer 111, and a relatively small concave (curved) surface (depression) 117 defined in aperture surface 115 (i.e., extending into upper layer 111). In order to minimize material, weight, thickness and optical adsorption, upper layer 111 may be vanishingly small. In one embodiment, optical element 110 is molded using a low-iron glass (e.g., Optiwhite glass produced by Pilkington PLC, UK) structure according to known glass molding methods. Alternatively, clear plastic may be machined and polished to form single-piece optical element 110, or separate pieces by be glued or otherwise secured to form optical element 110. In a preferred embodiment, optical element 110 is 5 to 12 mm thick and 20 to 40 mm wide. This thickness helps to ensure that the heat conduction path from the backside convex surface 112 to aperture surface 115 does not become too resistive as it would be if optical element 110 were either thicker or hollow.

PV cell 120 is located in a central first side (cavity) region 113 that is defined in the center of convex surface 112. PV cell 120 is connected by way of suitable conductors 122 and 124 (indicated in FIG. 2), for example, to the PV cells of adjacent CPV devices (not shown) using known techniques. Suitable photovoltaic (concentrator solar) cells are produced, for example, by Spectrolab, Inc. of Sylmar, Calif., USA.

Primary mirror 130 and secondary mirror 140 are respectively disposed on convex surface 112 and concave surface 117. Primary mirror 130 and secondary mirror 140 are shaped and arranged such that, as shown in FIG. 2, light beams LB traveling in a predetermined direction (e.g., perpendicular to aperture surface 115) that enters optical element 110 through a specific region of aperture surface 115 is reflected by a corresponding region of primary mirror 130 to an associated region of secondary mirror 140, and from the associated region of secondary mirror 140 to PV cell 120 (e.g., directly from secondary mirror 140 to PV cell 120, or by way of a reflective or refractive surface positioned between secondary mirror and PV cell 120). As used herein, directional terms such as "upper", "lower", "above" and "below" are intended to provide relative positions for purposes of description, and are not intended to designate an absolute frame of reference. In one embodiment, primary mirror 130 and secondary mirror 140 are fabricated by sputtering or otherwise depositing a reflective mirror material (e.g., silver (Ag) or aluminum (Al)) directly onto convex surface 112 and concave surface 117, thereby minimizing manufacturing costs and providing superior optical characteristics. By sputtering or otherwise forming a mirror film on convex surface 112 and concave surface 117 using a known mirror fabrication technique, primary mirror 130 substantially takes the shape of convex surface 112, and secondary mirror 140 substantially takes the shape of concave surface 117. As such, optical element 110 is molded or otherwise fabricated such that convex surface 112 and concave surface 117 are arranged and shaped to produce the desired mirror shapes. Note that, by forming convex surface 112 and concave surface 117 with the desired mirror shape and position, primary mirror 130 and secondary mirror 140 are effectively self-forming and self-aligning, thus eliminating expensive assembly and alignment costs associated with conventional concentrating solar collectors. Further, because primary mirror 130 and secondary mirror 140 remain affixed to optical element 110, their relative position is permanently set, thereby eliminating the need for adjustment or realignment that may be needed in conventional multiple-part arrangements. In one embodiment, primary mirror 130 and secondary mirror 140 are formed simultaneously using the same (identical) material or materials (e.g., plated Ag), thereby minimizing fabrication costs. Further, by utilizing the surfaces of optical element 110 to fabricate the mirrors, once light enters into optical element 110 through aperture surface 115, the light is only reflected by primary mirror 130/convex surface 112 and secondary mirror 140/concave surface 117 before reaching PV cell 120. As such, the light is subjected to only one air/glass interface (i.e., aperture surface 115), thereby minimizing losses that are otherwise experienced by conventional multi-part concentrating solar collectors. The single air/glass interface loss can be further lowered using an antireflection coating on aperture surface 115. Although it is also possible to separately form primary mirror 130 and secondary mirror 140 and then attach the mirrors to convex surface 112 and concave surface 117, respectively, this production method would greatly increase manufacturing costs and may reduce the superior optical characteristics provided by forming mirror films directly onto convex surface 112 and concave surface 117.

Heat spreader 150 includes a central portion 151 and a curved peripheral portion 152 extending outward from central portion 151. Heat spreader 150 includes a material having relatively high thermal conductivity, and includes a thickness selected such that a lateral thermal resistance TR1 of heat spreader 150 (i.e., measured in a radial direction from central portion 151 to the outer edge of peripheral portions 152) is less than a transverse thermal resistance TR2 of optical element 110 (i.e., measured from the convex surface 112 to the aperture surface 115). In one practical embodiment, many small CPV devices 100 are arrayed together in order to keep the volume of glass from becoming excessively large, and to keep the amount of power per PV cell manageable without active cooling. In the preferred embodiment, low-iron glass having a thickness of 5 to 12 mm is used for optical element 110, and heat spreader 150 includes a copper heat-distributing layer having a thickness of 70 microns (i.e., two ounce copper), which provides a thermal resistance TR1 that is greater than a thermal resistance TR2 of optical element 110. At this thickness, a lateral thermal resistance of the copper heat-distributing layer is greater than the transverse thermal resistance of the optical element.

As indicate in FIG. 2, central portion 151 of heat spreader 150 is disposed over cavity 113, and curved peripheral portion 152 is formed on or otherwise secured to the back (non-reflecting) surface of primary mirror 130. PV cell 120 is mounted on an inside surface of central portion 151 such that PV cell 120 is disposed inside cavity 113. A gap filling transparent adhesive 128, such as silicone (e.g., polydiphenylsiloxane or polymethylphenylsiloxane), is also disposed inside cavity 113 over PV cell 120, and serves to minimize the disruptive break in the refractive indices between the outside surface of cavity 113 and PV cell 120. Note that a central opening 131 is defined in primary mirror 130 to facilitate the passage of light through cavity 113 to PV cell 120. In one embodiment, PV cell 120 is mounted onto central region 151 by way of a heat slug 127. In another embodiment, one or more openings are formed in central region 151 and heat slug 127 to facilitate the passage of current from PV cell 120, e.g., by way of conductors 122 and 124. In another embodiment, current is transmitted to and from PV cell 120 by way of heat spreader 150 or primary mirror 130 in a manner similar to that disclosed in co-owned and co-pending U.S. patent application Ser. No. 11/110,611 (cited above).

Although primary mirror 130 and heat spreader 150 are illustrated as separate layers in FIGS. 1 and 2, in one embodiment a single layer may be formed on convex surface 112 that serves the functions of both primary mirror 130 and heat spreader 150. That is, mirror surfaces are typically formed using a thin 500 Angstrom Ag layer and one or more protective layers that may include a thin 1000 Angstrom Cu anti-migration layer and/or a barrier paint layer. Such conventional mirror surfaces exhibit a relatively high lateral thermal resistance that is insufficient for adequately distributing heat from PV cell 120 such that optical element 110 achieves uniform heat distribution. Hence, a relatively thick layer of a material (e.g., copper) exhibiting high thermal conductivity is formed over the backside of the mirror surface to provide the needed heat distribution. While these two separate layers are needed to provide both an optimal reflective surface and adequate heat transfer, it may be possible to utilize a single (e.g., silver or copper) layer to perform both the reflective and heat transfer functions. However, at this time, forming silver to the thickness needed to facilitate sufficient heat transfer is economically infeasible, and depositing copper using known techniques is considered to form an inadequate mirror surface.

FIG. 2 is a side view showing concentrating solar collector 100 during operation. Similar to conventional concentrating solar collectors, a collector positioning system (not shown; for example, the tracking system used in the MegaModule™ system produced by Amonix, Incorporated of Torrance, Calif., USA) is utilized to position concentrating solar collector 100 such that light beams LB (e.g., solar rays) are directed into aperture surface 115 in a desired direction (e.g., perpendicular to aperture surface 115. PV cell 120 is disposed substantially in a concentrating region F, which designates the region at which light beams LB are concentrated by primary mirror 130, secondary mirror 140 and any intervening optical structures (e.g., a dielectric flux concentrator) To facilitate the positioning of concentrating region F in central region 113, convex surface 112, primary mirror 130, concave surface 117, and secondary mirror 140 are centered on and substantially symmetrical about an optical axis X that extends substantially perpendicular to aperture surface 115 (i.e., the curved portions of convex surface 112 and concave surface 117 are defined by an arc rotated around optical axis X).

In accordance with the present invention, waste heat generated at focal point F (i.e., heat generated by solar energy that is not converted to electricity by PV cell 120) is transmitted via central portion 151 (by way of heat slug 127, when present) by conductive heat transfer to peripheral portion 152, as indicated by dashed line arrows CH1 in FIG. 2. For the purposes of this invention, the use of the term focal point refers both to concentration by imaging and non-imaging elements. The heat transferred to peripheral portions 152 in this manner is passed into optical element 110 via primary mirror 130 and convex surface 112, and are transmitted by conductive heat transfer to aperture surface 115, as indicated by dashed line arrows CH2 in FIG. 2. From aperture surface 115, the heat is radiated into space, as indicated by the wavy dashed line arrows RH.

FIG. 3 is a top-side exploded perspective view showing a CPV device 200 according to another embodiment of the present invention. Similar to concentrating solar collector 100, concentrating solar collector 200 includes an optical element 210, a photovoltaic cell 220, a primary mirror 230 formed on a convex surface 212 of optical element 210, a secondary mirror 240 formed on a concave surface 217 of optical element, and a heat spreader 250.

As indicated in FIG. 3, optical element 210 includes six contiguous facets 219 located around a peripheral edge of aperture surface 215. This six-sided arrangement facilitates the formation of large arrays of concentrating solar collectors 200 in a highly space-efficient manner, as discussed in additional detail in co-owned and co-pending U.S. patent application Ser. No. 11/110,611 (cited above). In other embodiments, less space-efficient concentrating solar collector arrays may be produced using concentrators having other peripheral shapes (e.g., the circular peripheral shape of concentrator 100, described above). A central region (cavity) 213 is defined in (e.g., molded into) convex surface 212 for receiving PV cell 220.

Figure 4:
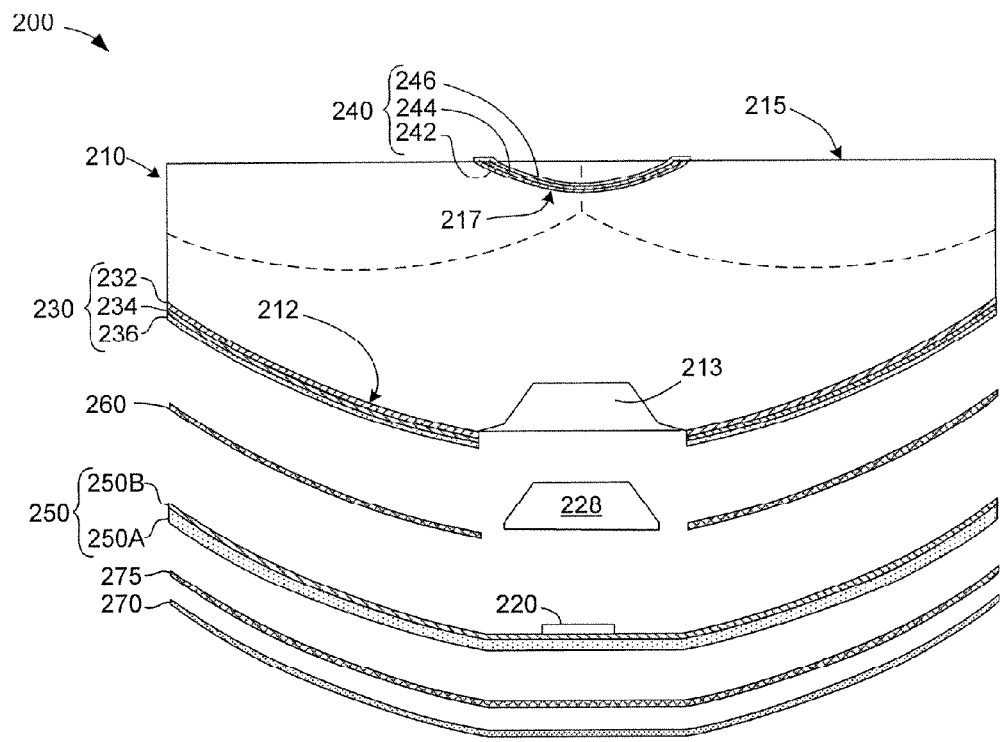
FIG. 4 is a cross-sectional side view showing CPV device of FIG. 3 in additional detail.

FIG. 4 is a simplified, partially exploded cross-sectional side view showing the various components of CPV device 200 in additional detail.

In one embodiment, a fabrication process for producing CPV device 200 begins by forming primary mirror 230 and secondary mirror 240 on optical element 210. First, highly reflective (mirror) material layers 232 and 242 (e.g., silver) are deposited on convex surface 212 and concave surface 217, respectively. The silver can be applied by various techniques including liquid silvering which is commonly used to produce mirrors on glass for architectural applications. The silver can also be applied by known sputtering techniques such as DC magnetron sputtering.

Next, anti-migration layers 234 and 244 (e.g., copper) are deposited over highly reflective material layers 232 and 242, respectively. In liquid immersion or spray techniques, this process typically uses an electroless Cu process. In a sputter process, metals such as titanium or inconel are used to cap and protect the silver from tarnishing. Next, optional barrier paint layers 234 and 246 are formed over anti-migration layers 234 and 244 respectively. The barrier paint is typically applied by a spray coating process and then baked to both dry and harden the paint layer.

Next, an inner adhesive layer 260 (e.g., EVA adhesive produced by Dupont) is deposited onto barrier layer 236, and a transparent adhesive 228 is deposited into cavity 213. For example, the cavity 213 can be filled with the adhesive in its uncured state prior to the lamination process. Care should be exercised when applying inner adhesive 260 to ensure none of it enters cavity 213. In an alternative embodiment, adhesive 260 is adhered to heat spreader 250 instead of optical element 210. Adhesive layer 260 has a nominal thickness of approximately 100 microns. Additional details regarding lamination of the various layers of CPV device 200 are disclosed in co-owned and co-pending U.S. patent application Ser. No. 11/382,008, entitled "LAMINATED SOLAR CONCENTRATING PHOTOVOLTAIC DEVICE", which is co-filed with the present application and incorporated herewith by reference in its entirety.

Figure 5:
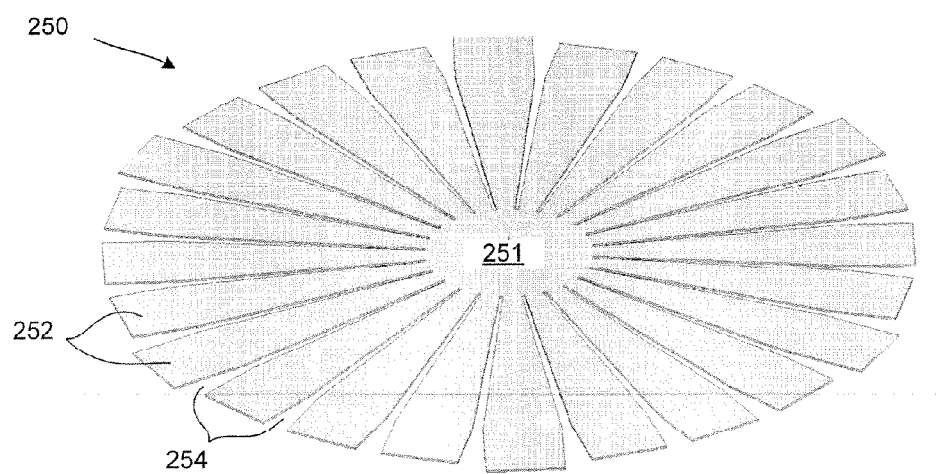
FIG. 5 is a perspective view showing a heat spreader substrate utilized in the CPV device of FIG. 3.

Heat spreader 250 is produced and assembled with PV cell 220 prior to being mounted onto adhesive layer 260. In accordance with another aspect of the present invention, heat spreader 250 is a multilayered substrate (referred to in the industry as "flex") including one or more layers of a conductive layer 250B (e.g., copper or other metal) formed on a flexible substrate 250A (e.g., a polyimide film such as Kapton® produced by DuPont Electronics, 0.5 mm thickness). Kapton flex that is suitable for the production of heat spreader 250 is available from 3M Corporation (St. Paul, Minn., USA). As shown in FIG. 5, heat spreader (flex) 250 is cut or otherwise patterned from a flat sheet to include a central portion 251 and multiple peripheral portions (radial arms) 252 that extend radially from central portion 251 and are separated by slits 254. PV cell 220 will typically have a top (illuminated side) electrical contact and a bottom electrical contact. PV cell 220, which is mounted on and in mechanical and electrical contact with heat spreader 250, may have its top electrical contact electrically connected to a heat slug which is in turn electrically connected to one electrical portion of the flex. The bottom electrical contact is electrically connected to a second electrical portion of the flex. In one embodiment, where there are multiple electrical paths in the thermal conductive layer 250B, both the base and emitter contacts of PV cell 220 are electrically connected to thermal conductive layer 250B. In an array of power units, a portion of conductor layer 250B may be used to carry current from PV cells 220 using series or parallel connections. The connections between PV cell 220 and thermal conductive layer 250B may either be direct, or through an intermediate package or heat slug. In an alternative embodiment, the copper conductive layer may be replaced with another metal or alloy (e.g., Alloy 42 (Fe—Ni alloy) exhibits a better CTE match to optical element 210, but is not as good of an electrical or thermal conductor. A further improvement is to form the heat spreader out of a bonded stack of metals, for example copper and Alloy 42. Such a structure has superior thermal expansion characteristics compared to copper without compromising electrical conductivity.

Figure 6:
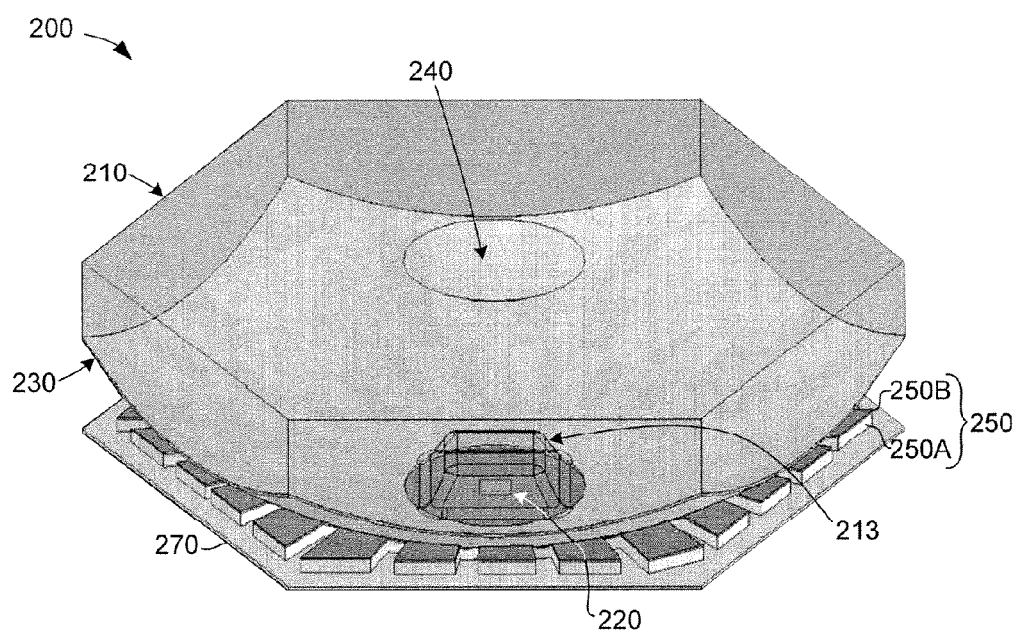
FIG. 6 is an assembled perspective view showing the CPV device of FIG. 3.

In accordance with another aspect of the present invention, heat spreader 250 is conformally attached to primary mirror 230 by way of adhesive layer 260 such that thermal conductive layer 250B is in good mechanical and thermal contact with optical element 210. Ordinarily, as indicated in FIG. 5, flex is processed in sheet or roll form, so it is inherently flat. By patterning peripheral portions 252A and 252B of heat spreader 250 in the manner shown in FIG. 5, both flexible substrate 250A and thermal conductive layer 250B conform to curved convex surface 212 when heat spreader 250 is mounted onto inner adhesive layer 260, as illustrated in FIGS. 3 and 6, thereby facilitating contouring of heat spreader 250 to provide close thermal contact between thermal conductive layer 250B and optical element 210. Holes may be punched through peripheral portions 252 to facilitate the communication between adhesive layers 260 and 275.

In alternative embodiments, heat spreader 250 may be implemented using stamped metal shim stock that is utilized to perform both heat transfer and electrical conduction functions. When multiple CPV devices of an array are parallel-wired, it may be feasible to make a stamped or formed part that includes the heat slug, spreader, and wiring, and has the emitter and base leads tied together outside the array so they can be trimmed and separated after lamination. The PV cells could slip into a "sandwich" which nests the cell from the front and makes contact to the back in a structure which goes through one solder reflow step to make both contacts. However, this arrangement might act like a guillotine and break cells when pressure is applied. An alternative embodiment is to form the heat slug, spreader and one side of the parallel wiring of an array of cells within the concentrator from a single stamped or formed metal part. The other side of the parallel wiring could be provided for example with a piece of flex. Additional details regarding the use of a heat slug and other packaging features are disclosed in co-owned and co-pending U.S. patent application Ser. No. 11/382,004, entitled "SOLAR CONCENTRATING PHOTOVOLTAIC DEVICE WITH RESILIENT CELL PACKAGE ASSEMBLY", which is co-filed with the present application and incorporated herewith by reference in its entirety.

In another alternative embodiment, a double-sided heat spreader arrangement that includes copper on both sides of Kapton substrate. This would make the structure more complex, but would eliminate a Kapton/EVA interface.

A protective plastic shell layer 270 (e.g., Tedlar® produced by DuPont with 150 micron thickness) is then secured onto the exposed surface of flexible substrate 250A using an outer (e.g., EVA) adhesive layer 275. Because Kapton is an inert material, suitable adherence to EVA may require surface preparation. For example, the surface may be prepared using a plasma treatment of the Kapton surface or a silane coupling agent applied to the Kapton prior to assembly. In one embodiment, the flex substrate may have a layer of EVA applied directly after this surface treatment before the components of the stack are assembled together for lamination.

CPV device 200 exploits the discovery that the thermal resistance of the flex conductive (e.g., copper) in the lateral direction is comparable to the thermal resistance of the optical element glass in the vertical direction. As a result of this for the proposed concentrator that has a glass thickness of 5 to 12 mm and a copper layer of 70 microns, neither part of the structure becomes a severe bottleneck for heat transfer from aperture surface 215. Adequate heat spreading ensures that radiative and convective cooling occurs over wide surface areas on the front and back of CPV device 200. This results in a more uniform surface temperature and a colder junction temperature for the PV cell. A thermal model of CPV device 200 during regular operating conditions for a cell with 35% electrical conversion efficiency in a 300° K ambient indicates the junction temperature rises less than 30° C. above ambient. In spite of the fact that this device concentrates the sun several hundred times and uses only passive cooling, the junction temperature of the cell rises only about 5° C. higher above the ambient than a conventional flat plate module collecting sunlight without any concentration. For the invention described herein, during normal operating conditions, the heat flow calculations predict that 67% or about two-thirds of the heat flowing out of the concentrator passes through the top surface.

Although the present invention has been described with respect to certain specific embodiments, it will be clear to those skilled in the art that the inventive features of the present invention are applicable to other embodiments as well, all of which are intended to fall within the scope of the present invention. For example, the primary and secondary mirrors may be preformed and then mounted to the optical element using a suitable adhesive, but this approach may substantially increase production costs. In yet another alternative embodiment, the curved surface utilized to form the secondary mirror may be convex instead of concave, thus being in the form of a classical Gregorian type system. In yet another alternative embodiment, the curved surfaces utilized to form the primary and secondary mirrors may be elliptical, ellipsoidal, spherical, or other curved shape.

The invention claimed is:

1. A concentrating photovoltaic (CPV) device comprising:
    a photovoltaic (PV) cell;
    a solid, light-transparent optical element having a first side including a convex surface and a second side including a substantially flat aperture surface and a curved surface in a central portion of the second side, wherein the curved surface is smaller than the convex surface;
    a primary mirror disposed on the convex surface and a secondary mirror disposed on the curved surface, the primary and secondary mirrors defining a focal region at which light received by the optical element is concentrated, wherein the PV cell is located in the focal region; and
    a heat spreader in thermal contact with the optical element and having a central portion disposed over the center of the convex surface of the optical element and one or more peripheral portions extending from the central portion over the first side,
    wherein the heat spreader comprises a thermally conductive material that is in contact with and conformally disposed over a back surface of the primary mirror such that heat generated at the focal region is passively transmitted from the heat spreader through the primary mirror and the optical element for radiation from the substantially flat aperture surface.

2. The CPV device according to claim 1,
    wherein the heat spreader has a lateral thermal resistance extending from the central portion to the peripheral portions,
    wherein the optical element has a transverse thermal resistance extending from the first surface to the second surface, and
    wherein the transverse thermal resistance is greater than the lateral thermal resistance.

3. The CPV device according to claim 1,
    wherein the optical element comprises glass having a thickness in the range of 5 to 12 mm and a diameter of approximately 28 mm, and
    wherein the heat spreader comprises copper having a nominal thickness of approximately 70 microns.

4. The concentrating solar collector according to claim 1, wherein the heat spreader comprises a laminate structure including one or more non-conductive layers and one or more metallization layers.

5. The CPV device according to claim 4,
    wherein the one or more non-conductive layers comprise a polyimide film, and
    wherein the one or more metallization layers comprise one of copper or an Fe—Ni alloy.

6. The CPV device according to claim 4, wherein the PV cell is electrically connected to one or more of the metallization layers.

7. The CPV device according to claim 1, wherein the one or more peripheral portions comprise a plurality of radial alms extending from the central portion, wherein each adjacent pair of radial arms is separated by an associated slit.

8. The CPV device according to claim 1,
    wherein a central region of the first side comprises a cavity, and
    wherein the PV cell is disposed inside the cavity between the central portion of the heat spreader and an adjacent surface of the optical element.

9. The CPV device according to claim 8, further comprising a transparent adhesive disposed in the cavity between the PV cell and said adjacent surface of the optical element.

10. The CPV device according to claim 1, further comprising a primary mirror disposed between the convex surface and the peripheral portions of the heat spreader, and a secondary mirror disposed on the curved surface, wherein the primary and secondary mirrors are arranged such that light entering the optical element through the aperture surface is concentrated onto the central region of the first side, whereby the concentrated light generates heat in the central region of the first side.

11. The CPV device according to claim 10, wherein the primary mirror and secondary mirror comprise reflective mirror films formed directly onto the convex surface and the curved surface, respectively.

12. The CPV device according to claim 11, wherein the primary mirror and the secondary mirror comprise silver, and wherein the heat spreader comprises copper.

13. The CPV device according to claim 10, wherein each of the primary mirror and secondary mirror comprises a reflective mirror layer, an anti-migration layer formed on the reflective mirror layer, and one or more barrier paint layers formed on the anti-migration layer.

14. The CPV device according to claim 10, wherein the reflective mirror layer comprises silver, and wherein the anti-migration layer comprises copper.

15. The CPV device according to claim 1, further comprising a protective shell layer disposed on a backside surface of the heat spreader.

16. A method for producing a concentrating photovoltaic (CPV) device comprising:
  forming a solid, light-transparent optical element having a convex surface defining a first side, an opposing aperture surface and a curved surface defined in a central portion of the aperture surface;
  forming primary and secondary mirrors on the convex surface and curved surface, respectively, thereby defining a focal region at which light received by the optical element through the aperture surface is concentrated;
  forming a heat spreader by patterning a flexible flat sheet to include a central portion and multiple peripheral portions extending radially from the central portion;
  mounting a photovoltaic (PV) cell directly on the central portion of the heat spreader, wherein mounting the heat spreader on the optical element comprises disposing the PV cell proximate to the first side; and
  mounting the heat spreader onto the optical element such that the multiple peripheral portions are in contact with and conformally disposed over the primary mirror disposed on the convex surface such that heat generated at the focal region is passively transmitted from the heat spreader through the primary mirror and the optical element for radiation from the substantially flat aperture surface.

17. The method of claim 16, wherein patterning the flexible flat sheet comprising patterning a flat sheet of copper.

* * * * *